United States Patent [19]

Kanbe et al.

[11] 4,443,529

[45] Apr. 17, 1984

[54] PHOTOCONDUCTIVE MEMBER HAVING AN AMORPHOUS SILICON PHOTOCONDUCTOR AND A DOUBLE-LAYER BARRIER LAYER

[75] Inventors: Junichiro Kanbe, Yokohama; Shigeru Shirai, Yamato; Tadaji Fukuda, Yokohama, all of Japan

[73] Assignee: Canon Kabushiki Kaisha, Tokyo, Japan

[21] Appl. No.: 368,368

[22] Filed: Apr. 14, 1982

[30] Foreign Application Priority Data

Apr. 24, 1981 [JP] Japan ................................. 56-62182

[51] Int. Cl.³ .................... G03G 5/04; G03G 5/082
[52] U.S. Cl. ..................................... 430/65; 430/130; 430/132; 430/67
[58] Field of Search .................... 430/57, 58, 65, 130, 430/132, 900; 427/93, 95

[56] References Cited

U.S. PATENT DOCUMENTS

| | | | |
|---|---|---|---|
| 4,217,374 | 0/0000 | Ovshinsky et al. | 430/58 |
| 4,225,222 | 0/0000 | Kempter | 430/58 |
| 4,226,898 | 0/0000 | Ovshinsky et al. | 430/58 |
| 4,265,991 | 0/0000 | Hirai et al. | 430/58 |
| 4,359,512 | 11/1982 | Fukuda et al. | 430/57 |

*Primary Examiner*—John E. Kittle
*Assistant Examiner*—John L. Goodrow
*Attorney, Agent, or Firm*—Fitzpatrick, Cella, Harper & Scinto

[57] ABSTRACT

A photoconductive member comprising a support for photoconductive member, a photoconductive layer constituted of an amorphous material comprising silicon atom as a matrix and a barrier layer between said support and said photoconductive layer, said barrier layer having a double-layer structure of a first barrier layer constituted of an amorphous material comprising silicon atom as a matrix and containing impurities which control the property of conductivity and a second barrier layer constituted of an electrically insulating material different from said amorphous material constituting said first barrier layer.

24 Claims, 3 Drawing Figures

PHOTOCONDUCTIVE MEMBER HAVING AN AMORPHOUS SILICON PHOTOCONDUCTOR AND A DOUBLE-LAYER BARRIER LAYER

BACKGROUND OF THE INVENTION

1. Field of the Invention

This invention relates to a photoconductive member having a sensitivity to an electromagnetic wave such as light [herein used in a broad sense, including ultraviolet rays, visible light, infrared rays, X-rays and gamma-rays].

2. Description of the Prior Arts

Photoconductive materials, which constitute photoconductive layers in solid state image pickup devices or in electrophotographic image forming members in the field of image formation, are required to have a high sensitivity, a high SN ratio [Photocurrent ($I_p$)/Dark current ($I_d$)], absorption spectral characteristics matching to those of an electromagnetic wave to be irradiated, a rapid response to light, a desired dark resistance value as well as no harm to human bodies during usage. Further, in a solid state image pickup device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German Laid-open Patent Applications Nos. 2746967 and 2855718 disclose applications of a-Si for use in image forming members for electrophotography, and German Laid-open Patent Application No. 2933411 an application of a a-Si for use in a photoelectric transducing reading device.

However, the photoconductive members having photoconductive layers constituted of a-Si of prior art have various problems in electrical, optical and photoconductive characteristics such as dark resistance value, photosensitivity and response to light, environmental characteristics in use such as humidity resistance, and stability, which should further be improved. Thus, in a practical solid state image pickup device, reading device or an image forming member for electrophotography including wide scope of applications, they cannot effectively be used also in view of their productivity and possibility of their bulk production.

For example, when applied in an image forming member for electrophotography, residual potential is frequently observed to remain during use thereof. When such a photoconductive member is repeatedly used for a long time, there will be caused various inconveniences such as accumulation of fatigues by repeated uses or so called ghost phenomenon wherein residual images are formed.

Further, for example, according to a number of experiments conducted by the present inventors, a-Si material constituting the photoconductive layer of an image forming member for electrophotography, while it has a number of advantages, as compared with Se, CdS, ZnO or OPC (organic photoconductive materials) such as PVCz or TNF of prior art, is also found to have several problems to be solved. Namely, when charging treatment is applied for formation of electrostatic images on the photoconductive layer of an image forming member for electrophotography having a photoconductive member constituted of a mono-layer of a-Si which has been endowed with characteristics for use in a solar cell of prior art, dark decay is markedly rapid, whereby it is difficult to apply a conventional photographic method or, in some cases, no charge can be retained at all until development.

In particular, in these points to be improved, it is important in practical application of an a-Si type image forming member for electrophotography to make attempts to lower the dark decay during charging treatment and the residual potential at the light portion when irradiated with an electromagnetic wave.

As an approach to solve the problem in this respect, there may be mentioned provision of a so called barrier layer, having the function to impede injection of free carriers into the photoconductive layer from the side of a support during charging treatment, between the support and the photoconductive layer, as has been applied in Se type or CdS type image forming members for electrophotography of prior art.

Such a proposal to provide a barrier layer between a support and a photoconductive layer may also be effective to some extent in a-Si type image forming members for electrophotography. But, under the present situation, due to the restriction in characteristics for affording simultaneously high sensitivity and high dark resistance of the a-Si type photoconductive layer, the range for optimum design of a-Si type image forming members for electrophotography is narrowed, whereby selection of materials satisfying productivity including cost can be possible only within a very limited range.

For example, when a barrier layer is provided between a support and an a-Si type photoconductive layer according to the method of prior art for the purpose of overcoming the above problem, the capacity to be charged is gradually lowered with repeated formations of electrostatic images until there will occur destruction of electric insulation in the barrier layer, thereby forming so called image defect spots on the transferred toner image. When the layer thickness of the barrier layer is increased in order to prevent such an insulation destruction, then the residual potential at the light portion is increased with increase of the layer thickness. As the result, so called fogging of the transferred toner image is caused, which is also another principal factor to lower the quality of the transferred image.

These points make the degree of freedom in optimum design of a-Si type photoconductive members narrower, thus making more severe selection of materials as well as of optimum designing conditions.

Accordingly, it is requirqd in designing of a photoconductive material to make efforts to obtain desirable characteristics as described above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography or solid state image pickup devices. It has now been found that a photoconductive member elaborated to have a specific layer structure comprising a photoconductive layer constituted of a so called hydrogenated amorphous silicon, a halogenated amorphous silicon or a halogen-containing hydrogenated amorphous silicon [hereinafter referred to comprehensively as a-Si(H, X)], which is an amorphous material containing at least one of hydrogen atom(H) and halogen atom(X) in a matrix of silicon, characterized by having a specific barrier layer as specified below interposed between said photoconductive layer and a support for supporting said photoconductive layer, is not only satisfactorily of practical use by overcoming all the problems as mentioned above but also has characteristic superior in substantially all respects to those of the photoconductive members of prior art, especially markedly excellent characteristics as a photoconductive member for electrophotography. The present invention is based on such a finding.

SUMMARY OF THE INVENTION

The primary object of the present invention is to provide a photoconductive member which is not only free from problems in practical application of dark decay and residual potential but also has constantly stable electrical, optical and photoconductive characteristics, being an all-environment type substantially without limitations with respect to the environment under which it is used, and excellent in photosensitive characteristic as well as in light fatigue resistance without deterioration after repeated uses.

Another object of the present invention is to provide a photoconductive member, which is high in photosensitivity in all visible light regions, excellent in matching with a semiconductor laser and rapid in light response.

Still another object of the present invention is to provide a photoconductive member, which is sufficiently capable of retaining charges at the time of charging treatment for formation of electrostatic images to the extent such that a conventional electrophotographic method can be effectively applied when it is provided for use as an image forming member for electrophotography, and substantially free from deterioration of its characteristics even in a highly humid atmosphere.

Further object of the present invention is to provide a photoconductive member for electrophotography capable of providing repeatedly and easily high quality images which are high in density, clear in halftone and high in resolution.

According to the present invention, there is provided a photoconductive member comprising a support for photoconductive member, a photoconductive layer constituted of an amorphous material comprising a matrix of silicon atom and a barrier layer between said support and said photoconductive layer, said barrier layer having a double-layer structure of a first barrier layer constituted of an amorphous material comprising a matrix of silicon atom and containing impurities which control the property of conductivity and a second barrier layer constituted of an electrically insulating material different from said amorphous material constituting said first barrier layer.

DETAILED DESCRIPTION OF THE PREFERRED EMBODIMENT

Figure 1:
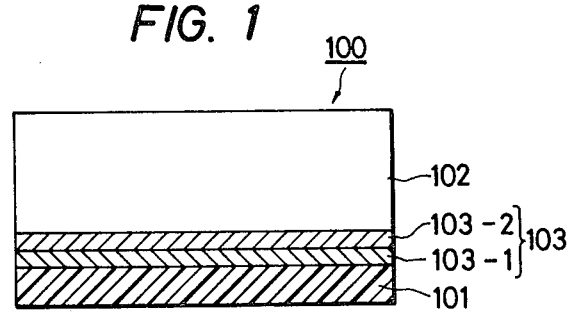
FIGS. 1 and 2 each shows a schematic sectional view for illustration of the constitution of a preferred embodiment of the photoconductive member according to the present invention.

Referring now to the drawings, the photoconductive member according to the present invention is to be described in detail.

FIG. 1 shows a schematic sectional view for illustration of the basic constitution of the photoconductive member according to the present invention.

The photoconductive member 100 shown in FIG. 1 is the most basic example of the present invention, which is constituted of a support 101 for photoconductive member, a photoconductive layer 102 provided on the support and a barrier layer 103 provided between the support 101 and the photoconductive layer 102 in direct contact therewith, the barrier layer 103 having a double-layer structure constituted of a first barrier layer 103-1 and a second barrier layer 103-2 successively layered from the side of the support.

The photoconductive member designed so as to take the layer structure as described above can overcome all of the various problems as described above and exhibits very excellent electrical, optical, photoconductive characteristics and environmental adaptability during usage.

In particular, when applied as an image forming member for electrophotography, it is excellent in charge retaining ability at the time of charging treatment without influence of residual potential on image formation, has electrical characteristics which are stable even in a humid atmosphere, as well as a high SN ratio with high sensitivity, being markedly excellent in light fatigue resistance and adaptability for repeated uses, and can provide a visible image of high quality which is high in density, clear in halftone and high in resolution.

Furthermore, a photoconductive member having a layer constitution of prior art cannot be applied for an image forming member for electrophotography in either the case of an a-Si:(H, X) with high dark resistivity or the case of an a-Si:(H, X) with high photosensitivity, since the former tends to be lowered in photosensitivity, while the latter has a low dark resistivity with at most $10^8$ ohm.cm. In contrast, in the present invention, even an a-Si:(H, X) layer with a relatively low resistivity ($5 \times 10^9$ ohm.cm. or more) can constitute a photoconductive layer for electrophotography owing to its particular layer constitution, and hence an a-Si:(H, X) having a high sensitivity but a relatively low resistivity can be sufficiently available. Thus, the restrictions with respect to the characteristics of a-Si:(H, X) can be alleviated.

The support 101 may be either electroconductive or insulating. As the electroconductive material, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports may suitably have at least one surface subjected to electroconduction treatment, and it is desirable to provide other layers on the side at which the electroconduction treatment has been applied.

For example, electroconduction treatment of a glass can be effected by providing a thin film of NiCr, Al, Cr, Mo, Au, Ir, Nb, Ta, V, Ti, Pt, Pd, In$_2$O$_3$, SnO$_2$, ITO(In$_2$O$_3$+SnO$_2$) thereon. Alternatively, a synthetic resin film such as polyester film can be subjected to the electroconduction treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10μ or more from the points of fabrication and handling of the support as well as its mechanical strength.

In the photoconductive member according to the present invention, both of the first barrier layer and the second barrier layer constituting the barrier layer to be provided on the support are excellent in the function to prevent injection of free carriers into the inner portion of the photoconductive layer from the support side.

And, the first barrier layer is endowed with the function to impede passage of free carriers during charging treatment and further with the function to permit easily passage of the photocarriers migrating to the support side among the carriers generated in the photoconductive layer at the irradiated portions during irradiation with an electromagnetic wave.

Thus, the barrier layer as a whole is excellent in the ability to impede passage of free carriers during charging treatment, as compared with each barrier layer alone, and therefore exhibits very excellent characteristics such that there is substantially no dark decay, and also substantially no residual potential at the irradiated portions during irradiation with an electromagnetic wave.

In the present invention, in order to achieve its objects effectively, the first barrier layer to be formed on the support is constituted of a-Si(H, X) which is so called as heavily doped with the impurities which control the conduction type as shown below.①　p+-type a-Si(H,X) . . . containing only acceptor; or containing both donor and acceptor with relatively higher concentration of acceptor (Na), having strong p-type tendency;②　n+-type a-Si(H,X) . . . containing only donor; or containing both donor and acceptor with relatively higher concentration of donor (Nd), having strong n-type tendency.

In the present invention in order to make an a-Si(H,X) having a conductivity of the type ① or ② incorporation of the impurities which control the property of conductivity, there may be contained in a desired amount in the layer formed, during formation of the first barrier layer, an impurity acting as p-type impurity for a-Si(H,X) in case of the type ① and an impurity acting as n-type impurity for a-Si(H,X) in case of the type ②.

In the present invention, as the impurity to be contained in the first barrier layer to make the layer of the type ①, there may suitably be employed an element of the Group III A in the Periodic table, for example, B, Al, Ga, In, Tl, etc.

When the layer is to be made of the type ② there may suitably be employed an element of the Group V A in the Periodic table, such as N, P, As, Sb, Bi, etc.

The amount of the impurity to be contained in the first barrier layer in the present invention is desired to be generally 30 to 5×10$^4$ atomic ppm, preferably 50 to 1×10$^4$ atomic ppm, most preferably 100 to 1000 atomic ppm in case of a p-type impurity; and generally 30 to 5×10$^4$ atomic ppm, preferably 50 to 1×10$^4$ atomic ppm, most preferably 50 to 1000 atomic ppm in case of a n-type impurity.

In the layer constitution of the photoconductive member according to the present invention as shown in FIG. 1, when the first barrier layer 103-1 is constituted with the use of the above p+-type a-Si(H,X), ⊕ charging of the surface of said photoconductive member is carried out selectively. In this case, the first barrier layer 103-1, which can impede effectively injection of electrons from the side of the support 101, acts synergetically with the second barrier layer 103-2 having the same function to enhance the receptor potential. Moreover, due to the dramatic decrease of the charges injected from the side of the support 101 which flow more or less during charging as compared with the case when the barrier is constituted of, for example, only the second barrier layer 103-2, durability of the barrier layer 103-2 can markedly be improved.

When the first barrier layer 103-1 is constituted of n+ type a-Si(H,X), injection of positive holes from the support can effectively be impeded, and therefore there can selectively be used ⊖ charging on the surface of the photoconductive member.

The layer thickness of the first barrier layer in the present invention may suitably be determined as desired in relation to the layer thickness of the second barrier layer to be layered on said layer and its characteristics as well as the content of the impurities, but may be generally 50 Å to 2μ, preferably 200 Å to 5000 Å, most preferably 500 Å to 3000 Å.

In the present invention, typical examples of halogen atom (X) to be incorporated in the first barrier layer are fluorine, chlorine, bromine and iodine, especially preferably fluorine and chlorine.

In the present invention, formation of the first barrier layer constituted of a-Si(H,X) of the type ① or ② may be conducted according to the vacuum deposition method utilizing discharging phenomenon, including discharging decomposition method such as glow discharge method or arc discharge method, sputtering method or ion-plating method. For example, for formation of the first barrier layer of the type ① or ② constituted of a-Si(H,X) according to the glow discharge method, a starting gas for introduction of hydrogen atom or/and halogen atom is introduced together with a starting gas capable of forming Si into the deposition chamber which can internally be brought to reduced pressure, wherein glow discharge is excited thereby to form a layer of a-Si(H,X) on the surface of a support placed at a predetermined position in the chamber. When it is to be formed according to the sputtering method, a starting gas for introduction of hydrogen atom or/and halogen atom may be introduced into the deposition chamber for sputtering, when effecting sputtering upon the target formed of Si in an atmosphere of an inert gas such as Ar, He or a gas mixture based on these gases.

The Si forming starting gas to be used in the present invention may include gaseous or gasifiable silicon hydrides (silanes) such as $SiH_4$, $Si_2H_6$, $Si_3H_8$, $Si_4H_{10}$ and others as effective materials. In particular, $SiH_4$, $Si_2H_6$ and $Si_3H_8$ are preferred for easy handling during layer formation and good Si forming efficiency.

As the effective starting gas for incorporation of halogen atom to be used in the present invention, there may be mentioned a number of halogen compounds such as halogen gases, halides, interhalogen compounds and silane derivatives substituted with halogen which are gaseous or gasifiable.

Alternatively, it is also effective in the present invention to use gaseous or gasifiable silicon compounds containing halogen atom which is constituted of both silicon atom and halogen atom.

Typical examples of halogen compounds preferably used in the present invention may include halogen gases such as of fluorine, chlorine, bromine or iodine and interhalogen compounds such as $BrF$, $ClF$, $ClF_3$, $BrF_5$, $BrF_3$, $IF_7$, $IF_5$, $ICl$, $IBr$, etc.

As the silicon compounds containing halogen atom, namely silane derivative substituted with halogen, silicon halides such as $SiF_4$, $Si_2F_6$, $SiCl_4$, $SiBr_4$, or the like are preferred.

When the specific first barrier layer of the present invention is formed according to the glow discharge method by use of such a silicon compound containing halogen atom, it is possible to form a first barrier layer constituted of a-Si containing halogen atom on a given support without use of a silicon hydride gas as the starting gas capable of forming Si.

In forming the first barrier layer containing halogen atom(X) according to the glow discharge method, the basic procedure comprises feeding a starting gas for forming Si, namely a gas of silicon halide, and a gas such as $H_2$, Ar, He, etc. at a predetermined ratio in a suitable gas flow amount into the deposition chamber for formation of the first barrier layer, followed by excitation of glow discharge to form a plasma atmosphere of these gases, thereby forming the first barrier layer on a support. It is also possible to form a layer by mixing a gas of a silicon compound containing hydrogen atom at a suitable ratio with these gases in order to incorporate hydrogen atom therein.

Each of the gases may be either a single species or a mixture of plural species at a predetermined ratio.

For formation of a first barrier layer of a-Si(H,X) of the type ① or ② by the reactive sputtering method or the ion-plating method, for example, a target of Si is used and sputtering is effected thereon in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for introduction of halogen atom(X) into the layer formed, a gas of a halogen conpound as mentioned above or a silicon compound containing halogen atom as mentioned above may be introduced into the deposition chamber to form a plasma atmosphere of the gas therein When hydrogen atom(H) is to be introduced, a starting gas for introduction of hydrogen atom such as $H_2$ or a gas such as silanes as mentioned above may be introduced into the deposition chamber for sputtering to form a plasma atmosphere of the gas.

In the present invention, as the starting gas for introduction of halogen atom, the halogen compounds or silicon compounds containing halogen as mentioned above can effectively be used. In addition, it is also possible to use a gaseous or gasifiable halide containing hydrogen atom as one of the constituents such as hydrogen halide, including HF, HCl, HBr, HI and the like or halogen-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of the first barrier layer.

These halides containing hydrogen atom, which can introduce hydrogen atom very effective for controlling electrical or optical characteristics into the layer during formation of the first barrier layer simultaneously with introduction of halogen atom(X), can preferably be used as the starting material for introduction of halogen atom.

For incorporation of hydrogen atom(H) structurally into the first barrier layer, $H_2$ or a gas of silicon hydride, including $SiH_4$, $Si_2H_6$, $Si_3H_8$, $Si_4H_{10}$ and so on may be permitted to be co-present with a silicon compound for supplying Si in a deposition chamber, wherein discharging is caused.

For example, in case of the reactive sputtering method, a Si target is used and a gas for introduction of halogen atom and $H_2$ gas are introduced together with, if necessary, an inert gas such as He, Ar, etc. into a deposition chamber, wherein a plasma atmosphere is formed to effect sputtering of the Si target, thereby forming a first barrier layer of a-Si(H,X) of the type ① or ② on the surface of a support having desired characteristics.

Further, there may also be introduced a gas such as of $B_2H_6$, $PH_3$, $PF_3$ or others in order to effect also doping of impurities.

The amount of H or X or (H+X) contained in the first barrier layer 103-1 in the photoconductive member formed in the present invention may be generally at a level effective for impeding sufficiently charges, preferably 1 to 40 atomic %, most preferably 5 to 30 atomic %.

For controlling the amounts of hydrogen atom(H) or/and halogen atom(X) in the layer, the support temperature or/and the amounts of the starting material for incorporation of H to be introduced into the deposition device system or the discharging power may be controlled.

In order to make the first barrier layer with conductivity of the type ① or ② as mentioned above by incorporation of impurities for controlling conductivity into the barrier layer, an impurity acting as a n-type or acting as a p-type impurity for a-Si(H,X) or both of these impurities can be doped into the layer in a controlled amount during formation of the layer by the glow discharge method or the reactive sputtering method.

These impurities may be incorporated into the first barrier layer according to, for example, the sputtering method wherein these impurities are contained at a desired mixing ratio in a target and sputtering effected thereon, or alternatively according to the glow discharge method wherein they are introduced in the form of compounds such as $BF_3$, $BCl_3$, $B_2H_6$, $B_4H_{10}$, $B_5H_9$, $B_5H_{11}$, $B_6H_{10}$, $B_6H_{12}$, $NH_3$, $PH_3$, $AsH_3$, $SbH_3$, $BiH_3$, $PF_3$, $PF_5$, $PCl_3$, $AsF_3$, $AsCl_3$, $AsF_5$, etc. under gaseous state together with a starting gas for Si formation into a glow discharging deposition chamber, wherein glow discharging is excited.

The second barrier layer is constituted of an electrically insulating amorphous material comprising a matrix of silicon atom containing at least one selected from carbon atom, nitrogen atom and oxygen atom, further containing, if necessary, at least one of hydrogen atom(H) or halogen atom(X) [these are represented comprehensively by "a-$[Si_x(C,N,O)_{1-x}]_y(H,X)_{1-y}$" (where $0 < x < 1$, $0 < y < 1$)]; or an electrically insulating metal oxide.

In the present invention, as halogen atom(X), F, Cl, Br and I, especially F and Cl are preferred.

Typical examples of the amorphous materials effectively used in the present invention for constitution of the above second barrier layer may include carbon type amorphous materials as exemplified by a-$Si_aC_{1-a}$, a-$(Si_bC_{1-b})_cH_{1-c}$, a-$(Si_dC_{1-d})_eX_{1-e}$, a-$(Si_fC_{1-f})_g(H+X)_{1-g}$; nitrogen type amorphous materials as exemplified by a-$Si_hN_{1-h}$, a-$(Si_iN_{1-i})_jH_{1-j}$, a-$(Si_kN_{1-k})_lX_{1-l}$, a-$(Si_mN_{1-m})_n(H+X)_{1-n}$; oxygen type amorphous materials as exemplified by a-$Si_oO_{1-o}$, a-$(Si_pO_{1-p})_qH_{1-q}$, a-$(Si_rO_{1-r})_sX_{1-s}$, a-$(Si_tO_{1-t})_u(H+X)_{1-u}$; and further amorphous materials containing at least two kinds of atoms of carbon atom(C), nitrogen atom(N) and oxygen atom(O) as constituent atoms in the above amorphous materials (wherein $0 <$ a, b, c, d, e, f, g, h, i, j, k, l, m, n, o, p, q, r, s, t, u $< 1$).

These amorphous materials are chosen optimally depending on the characteristics required for the second barrier layer according to the optimum design of the layer structure and easiness in continuous preparation of the first barrier layer provided in contact with the second barrier layer and the photoconductive layer. In particular, from aspects of characteristics, it is more preferable to choose a carbon type or a nitrogen type amorphous material.

The second barrier layer constituted of the above amorphous material may be formed by the glow discharge method, the sputtering method, the ion implantation method, the ion plating method, the electron-beam method or the like. These production methods are suitably selected depending on the factors such as production conditions, the degree of loading of installation capital investment, production scale, the desirable characteristics of the photoconductive members to be prepared, etc. But the glow discharge method or the sputtering method may preferably be adopted for the advantages of easy control of the conditions for preparation of a photoconductive member having desirable characteristic as well as easy incorporation of other atoms such as carbon atom, nitrogen atom, oxygen atom, or, if necessary, hydrogen atom or halogen atom together with silicon atom into the second barrier layer prepared.

Further, in the present invention, the glow discharge method and the sputtering method may be employed in combination in the same device system to form the second barrier layer.

For formation of the second barrier layer according to the glow discharge method, the starting gases for formation of the aforesaid amorphous material constituting the aforesaid first barrier layer, which may be admixed, if necessary, with a diluting gas at a desired mixing ratio, may be introduced into the chamber for vacuum deposition in which the support is placed, and the gas introduced is converted to a gas plasma by excitation of glow discharge in the chamber thereby to deposit the aforesaid amorphous material on the first barrier layer already formed on the support.

In the present invention, the substances effectively used as the starting materials for formation of a second barrier layer constituted of a carbon type amorphous material may include silicon hydride gases constituted of Si and H atoms such as silanes, as exemplified by $SiH_4$, $Si_2H_6$, $Si_3H_8$, $Si_4H_{10}$, etc., and hydrocarbons constituted of C and H atoms such as saturated hydrocarbons having 1 to 5 carbon atoms, ethylenic hydrocarbons having 2 to 5 carbon atoms and acethylenic hydrocarbons having 2 to 4 carbon atoms.

More specifically, typical examples are saturated hydrocarbons such as methane($CH_4$), ethane($C_2H_6$), propane ($C_3H_8$), n-butane(n-$C_4H_{10}$), pentane($C_5H_{12}$) and the like; ethylenic hydrocarbons such as ethylene($C_2H_4$), propylene($C_3H_6$), butene-1($C_4H_8$), butene-2($C_4H_8$), isobutylene($C_4H_8$), pentene ($C_5H_{10}$) and the like; and acetylenic hydrocarbons such as acetylene($C_2H_2$), methylacetylene($C_3H_4$), butyne($C_4H_6$) and the like.

Typical examples of the starting gas having silicon atom(Si), carbon atom(C) and hydrogen atom(H) as constituent atoms are alkyl silanes such as $Si(CH_3)_4$, $Si(C_2H_5)_4$ and the like. In addition to these starting gases, $H_2$ can of course be effectively used as the starting gas for introduction of hydrogen atom.

The starting gases for incorporation of halogen atom (X) for constitution of the second barrier layer with a carbon type amorphous material containing halogen atom may include single substances of halogen, hydrogen halides, interhalogen compounds, silicon halides, halogen-substituted silicon hydrides, etc.

More specifically, there may be included simple substances of halogen such as halogen gases of fluorine, chlorine, bromine and iodine; hydrogen halides such as HF, HI, HCl, HBr, etc.; interhalogen compounds such as BrF, ClF, $ClF_3$, $ClF_5$, $BrF_5$, $BrF_3$, $IF_7$, $IF_5$, ICl, IBr etc.; silicon halides such as $SiF_4$, $Si_2F_6$, $SiCl_4$, $SiCl_3Br$, $SiCl_2Br_2$, $SiClBr_3$, $SiCl_3I$, $SiBr_4$, etc.; halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$.

In addition to those mentioned above, there are halogen-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$, etc.; and silane derivatives such as halogen-containing alkyl silanes such as $SiCl(CH_3)_3$, $SiCl_2(CH_3)_2$, $SiCl_3CH_3$, etc.

These substances for forming the second barrier layer are chosen as desired and used in formation of a second barrier layer so that silicon atom, carbon atom and, if necessary, halogen atom(X) or/and hydrogen atom(H) may be contained at a desirable composition in the second barrier layer formed.

For example, $Si(CH_3)_4$, which can easily accomplish incorporation of silicon atom, carbon atom and hydrogen atom and form a second barrier layer with desirable characteristics and $SiHCl_3$, $SiCl_4$, $SiH_2Cl_2$ or $SiH_3Cl$, as a substance for incorporation of halogen atom, may be introduced at a predetermined mixing ratio in a gaseous state into a device for formation of a second barrier layer, in which glow discharge is excited to form a second barrier layer constituted of a-$(Si_fC_{1-f})_g(X+H)_{1-g}$.

In the present invention, when the glow discharge method is adopted for forming the second barrier layer with a nitrogen type amorphous material, desired substances selected from those mentioned above for formation of the second barrier layer may be used in combination with a starting gas for introduction of nitrogen atom. That is, as the starting materials for introduction of nitrogen atom for formation of the second barrier layer, there may be mentioned, gaseous or gasifiable nitrogen compounds constituted of nitrogen atom(N) or nitrogen atom(N) and hydrogen atom(H) such as nitrogen, nitrides and azides, including for example, nitrogen($N_2$), ammonia($NH_3$), hydrazine($N_2NNH_2$), hydrogen azide($HN_3$) ammonium azide($NH_4N_3$), and so on.

In addition, it is also possible to use a nitrogen halide compound which can incorporate nitrogen atom and halogen atom, such as nitrogen trifluoride($F_3N$), nitrogen tetrafluoride($F_4N_2$).

When the glow discharge method is adopted for constituting the second barrier layer with an oxygen type amorphous material, a desirable starting material is selected form those for formation of the second barrier layer as mentioned above, and a starting material for incorporation of oxygen atom is added thereto. As such starting materials for incorporation of oxygen atom, there may be employed most of gaseous substances or gasified gasifiable substances containing at least oxygen atom as constituent atom.

For example, in case of using a starting gas containing Si as constituent atom, it is possible to use a mixture of a starting gas having Si as constituent atom, a starting gas having O as constitutent atom and, if necessary, a gas having H and/or X as constituent atoms at a desired mixing ratio. Alternatively, a mixture of a starting gas having Si as constituent atom and a starting gas having O and H as constituent atoms at a desired mixing ratio can also be used. Further it is also possible to use a mixture of a strating gas having Si as constituent atom and a starting gas having the three atoms of Si, O and H constituent atoms.

As another method, it is also possible to use a mixture of a starting gas having Si and H as constituent atoms and a starting gas having O as constituent atom.

More specifically, there may be mentioned oxygen-($O_2$), ozone($O_3$), carbon monoxide(CO), carbon dioxide($CO_2$), nitrogen monoxide(NO), nitrogen dioxide($NO_2$), dinitrogen oxide($N_2O$), dinitrogen trioxide($N_2O_3$), dinitrogen tetraoxide ($N_2O_4$), dinitrogen pentoxide($N_2O_5$), nitrogen trioxide($NO_3$), lower siloxanes containing Si, O and H as constituent atoms such as disiloxane($H_3SiOSiH_3$), trisiloxane($H_3SiOSiH_2OSiH_3$), etc.

As described above, when forming a second barrier layer according to the glow discharge method, the starting materials for formation of the second barrier layer can variously be selected to form a second barrier layer constituted of a desired constituent material having desired characteristics. In case of forming a second barrier layer according to the glow discharge method, specific examples of good combinations of starting materials may include a single gas such as $Si(CH_3)_4$ or $SiCl_2(CH_3)_2$, or a gas mixture such as $SiH_4$-$N_2O$ system, $SiH_4$-$O_2$(-Ar) system, $SiH_4$-$NO_2$ system, $SiH_4$-$O_2$-$N_2$ system, $SiCl_4$-$CO_2$-$H_2$ system, $SiCl_4$-$NO$-$H_2$ system, $SiH_4$-$NH_3$ system, $SiCl_4$-$NH_4$ system, $SiH_4$-$N_2$ system, $SiH_4$-$NH_3$-$NO$ system, $Si(CH_3)_4$-$SiH_4$ system, $SiCl_2(CH_3)_2$-$SiH_4$ system, etc.

For formation of the second barrier layer constituted of a carbon type amorphous material by the sputtering method, a single crystalline or polycrystalline Si wafer or C wafer or a wafer containing Si and C mixed therein is used as target and subjected to sputtering in an atmosphere of various gases.

For example, when Si wafer is used as target, a starting gas for introduction of carbon atom and hydrogen atom(H) or halogen atom(X), which may be diluted with a diluting gas, if desired, is introduced into a deposition chamber for sputter to form a gas plasma therein and effect sputtering of the Si wafer.

Alternatively, Si and C as separate targets or one sheet target of a mixture of Si and C can be used and sputtering is effected in a gas atmosphere containing at least H atom or halogen atom.

As the starting gas for introduction of carbon atom, or hydrogen atom or halogen atom, there may be employed those for the glow discharge as described above as effective gases also in case of sputtering.

For formation of the second barrier layer constituted of a nitrogen type amorphous material by the sputtering method, a single crystalline or polycrystalline Si wafer or $Si_3N_4$ wafer or a wafer containing Si and $Si_3N_4$ mixed therein is used as target and subjected to sputtering in an atmosphere of various gases.

For example, when Si wafer is used as target, a starting gas for introduction of nitrogen atom and, if necessary, hydrogen atom(H) or/and halogen atom(X), such as $H_2$ and $N_2$ or $NH_3$, which may be diluted with a diluting gas, if desired, is introduced into a deposition chamber for sputter to form a gas plasma therein and effect sputtering of the Si wafer.

Alternatively, Si and $Si_3N_4$ as separate targets or one sheet target of a mixture of Si and $Si_3N_4$ can be used and sputtering is effected in an atmosphere of a diluted gas as the gas for sputtering, or in a gas atmosphere containing at least H atom and/or X atom.

As the starting gas for introduction of nitrogen atom, there may be employed those for introduction of N atom among the starting gases for formation of the second barrier layer as shown in case of using the glow discharge method as described above as effective gases also in case of sputtering.

For formation of the second barrier layer constituted of an oxygen type amorphous material by the sputtering method, a single crystalline or polycrystalline Si wafer, $SiO_2$ wafer, a wafer containing Si and $SiO_2$ mixed therein, or a combination of these wafers is used as target and subjected to sputtering in an atmosphere of various gases.

For example, when Si wafer is used as target, a starting gas for introduction of oxygen atom and, if necessary hydrogen atom or/and halogen atom, which may be diluted with a diluting gas, if desired, is introduced into a deposition chamber for sputter to form a gas plasma therein and effect sputtering of the Si wafer.

Alternatively, Si and $SiO_2$ as separate tergets or one sheet target of a mixture of Si and $SiO_2$ can be used and sputtering is effected in a diluting gas atmosphere as the gas for sputtering or in a gas atmosphere containing at least hydrogen atom (H) or/and halogen atom (X) as constituent elements. As the starting gas for introduction of oxygen atom, there may be employed those as mentioned in case of using the glow discharge as described above as effective gases also in case of sputtering.

In the present invention, as the diluting gas to be employed in forming the second barrier layer according to the glow discharge method or the sputtering method, there may be included so called rare gases such as He, Ne or Ar as suitable ones.

The second barrier layer in the present invention is formed carefully so that the characteristics required may be given exactly as desired.

That is, a substance constituted of Si and at least one of C, N and O, and optionally H or/and X can take structurally various forms from crystalline to amorphous, electrical properties from conductive through semiconductive to insulating, and photoconductive properties from photoconductive to non-photoconductive depending on the preparation conditions. In the present invention, the preparation conditions are severely selected so that there may be formed non-photoconductive and electrically insulating amorphous materials.

As a critical factor in the conditions for preparation of the second barrier layer of the aforesaid amorphous material having the characteristics as described above, there may be mentioned the support temperature during preparation of the layer.

That is, in forming the second barrier layer constituted of the aforesaid amorphous material on the surface of the first barrier layer, the support temperature during the layer formation is an important factor affecting the structure and characteristics of the layer formed. In the present invention, the support temperature during the layer formation is severely controlled so that the aforesaid amorphous material having the intended characteristics may be prepared exactly as desired.

In order that the objects of the present invention may be achieved effectively, the support temperature during formation of the second barrier layer is selected optimally within the range depending on the method for formation of the second barrier layer, and may generally be in the range of 20° C. to 350° C., preferably 50° C. to 300° C., most preferably 100° C. to 250° C. For formation of the second barrier layer, it is advantageous to adopt the glow discharge method or sputtering method in that continuous formation of from the whole barrier layer to the photoconductive layer is possible in the same system and delicate control of the composition of the atoms constituting respective layers and their layer thicknesses is relatively easy. When the second barrier layer is to be formed according to these layer forming methods, the discharging power and gas pressure during layer formation may be mentioned as important factors influencing the characteristics of the second barrier layer similarly as the support temperature as described above.

The discharging power conditions for preparing effectively with good productivity the second barrier layer having the characteristics to achieve the objects of the present invention is generally 1 to 300 W, preferably 2 to 150 W. As to the gas pressure in the deposition chamber, it is generally $3 \times 10^{-3}$ to 5 Torr, preferably $8 \times 10^{-3}$ to 0.5 Torr.

The contents of carbon atom, nitrogen atom, oxygen atom and hydrogen atom, halogen atom in the second barrier layer in the photoconductive member of this invention are also important factors for forming a second barrier layer having the desired characteristics to achieve the objects of the present invention, similarly as the preparation conditions thereof.

When the second barrier layer is constituted of a-$Si_aC_{1-a}$, the content of carbon atom relative to silicon in terms of representation by a is 0.1 to 0.4, preferably 0.2 to 0.35, most preferably 0.25 to 0.3. In case of a-$(Si_bC_{1-b})_cH_{1-c}$, the content of carbon atom in terms of representation by b and c are generally 0.1 to 0.5, preferably 0.1 to 0.35, most preferably 0.15 to 0.3 for b, and generally 0.60 to 0.99, preferably 0.65 to 0.98, most preferably 0.7 to 0.95 for c, respectively. In case of a-$(Si_dC_{1-d})_eX_{1-e}$ or a-$(Si_fC_{1-f})_g(H+X)_{1-g}$, the content of carbon atom is generally 40 to 90 atomic %, preferably 50 to 90 atomic %, most preferably 60 to 80 atomic %, the content of halogen atom or the total content of halogen atom and hydrogen atom is generally 1 to 20 atomic %, preferably 1 to 18 atomic %, most preferably 2 to 15 atomic %, the hydrogen atom content when both halogen atom and hydrogen atom are contained is generally 19 atomic % or less, preferably 13 atomic % or less, namely in terms of representation by d, e, f and g, d or f being generally 0.1 to 0.47, preferably 0.1 to 0.35, most preferably 0.15 to 0.3 and e or g being generally 0.8 to 0.99, preferably 0.82 to 0.99, most preferably 0.85 to 0.98.

When the second barrier layer is constituted of a nitrogen type amorphous material, first in case of a-$Si_hN_{1-h}$, the content of nitrogen atom is generally 0.43 to 0.60, preferably 0.43 to 0.50 in terms of h.

In case of a-$(Si_iN_{1-i})_jH_{1-j}$, the content of nitrogen atom in terms of representation by i and j, are generally 0.43 to 0.6, preferably 0.43 to 0.5 for i, and generally 0.65 to 0.98, preferably 0.7 to 0.95 for j, respectively. In case of a-$(Si_kN_{1-k})_lX_{1-l}$ or a-$(Si_mN_{1-m})_n(H+X)_{1-n}$, the content of nitrogen atom is generally 30 to 60 atomic %, preferably 40 to 60 atomic %, the content of halogen atom or the total content of halogen atom and hydrogen atom is generally 1 to 20 atomic %, preferably 2 to 15 atomic %, the hydrogen atom content when both halogen atom and hydrogen atom are contained is generally 19 atomic % or less, preferably 13 atomic % or less, namely in terms of representation by k, l, m and n, k or l being generally 0.43 to 0.60, preferably 0.43 to 0.49 and m or n being generally 0.8 to 0.99, preferably 0.85 to 0.98.

When the second barrier layer is constituted of an oxygen type amorphous material, first in case of a-$Si_oO_{1-o}$, the content of oxygen atom is generally 0.33 to 0.40, preferably 0.33 to 0.37 in terms of o.

In case of $(Si_pO_{1-p})_qH_{1-q}$, the content of oxygen atom in terms of representation by p and q are generally 0.33 to 0.40, preferably 0.33 to 0.37 for p, and generally 0.65 to 0.98, preferably 0.70 to 0.95 for q, respectively.

When the second barrier layer is constituted of a-$(Si_rO_{1-r})_sX_{1-s}$ or a-$(Si_tO_{1-t})_u(H+X)_{1-u}$, the content of oxygen atom is generally 48 to 66 atomic %, preferably 51 to 66 atomic %, the content of halogen atom or the total content of halogen atom and hydrogen atom generally 1 to 20 atomic %, preferably 2 to 15 atomic %, with the content of hydrogen atom, when both halogen atom and hydrogen atom are contained, being 19 atomic % or less, preferably 13 atomic % or less. As represented in terms of r, s, t and u, r or s is generally 0.33 to 0.40, preferably 0.33 to 0.37, and t or u generally 0.80 to 0.99, preferably 0.85 to 0.98.

In the present invention, as electrically insulating metal oxides for constituting the second barrier layer, there may preferably be mentioned $TiO_2$, $Ce_2O_3$, $ZrO_2$, $HfO_2$, $GeO_2$, $CaO$, $BeO$, $P_2O_5$, $Y_2O_3$, $Cr_2O_3$, $Al_2O_3$, $MgO$, $MgO \cdot Al_2O_3$, $SiO_2 \cdot MgO$, etc. A mixture of two or more kinds of these compounds may also be used to form the second barrier layer.

The second barrier layer constituted of an electrically insulating metal oxide may be formed by the vacuum deposition method, the CVD (chemical vapor deposition) method, the glow discharge decomposition method, the sputtering method, the ion implantation method, the ion-plating method, the electron-beam method or the like. These preparation methods may be suitably selected depending on the preparation conditions, the degree of loading of capital investment, production scale, the desired characteristics of the photoconductive member to be prepared.

For formation of the second barrier layer by the sputtering method, for example, a wafer for formation of a second barrier layer may be used as target and subjected to sputtering in an atmosphere of various gases such as He, Ne or Ar.

When the electron-beam method is used, there is placed a starting material for formation of the barrier layer in a boat for deposition, which may in turn be irradiated by an electron beam to effect vapor deposition of the material.

The numerical range of the layer thickness of the second barrier layer is also another important factor to achieve effectively the object of this invention and should be determined suitably as desired in correlation with the characteristics and the layer thickness of the first barrier layer.

In view of the above points, the layer thickness of the second barrier to achieve effectively the objects of this invention is desired to be generally 10 Å to 1.2 $\mu$, preferably 30 Å to 1000 Å, most preferably 50 Å to 800 Å.

The photoconductive layer in the photoconductive member according to the present invention, which has the function to generate photocarriers by absorption primarily of light irradiated at the time of electrostatic image formation, is constituted of a-Si(H, X) having the semiconductor characteristics as shown below and spectral sensitivity to the wavelength region of the electromagnetic wave employed.

③ p-type a-Si(H,X) ... containing only acceptor, or containing both donor and acceptor with relatively higher acceptor concentration (Na);

④ p⁻type a-Si(H,X) ... in the type of ③, that having a relatively lower acceptor concentration (Na), for example the type lightly doped with a p-type impurity;

⑤ n-type a-Si(H,X) ... containing only donor; or containing both donor and acceptor with relatively higher donor concentration (Nd);

⑥ n⁻-type a-Si(H,X) ... in the type of ⑤, that having a relatively lower donor concentration (Nd), for example non-doped type or the type lightly doped with a n-type impurity; and ⑦ i-type a-Si(H,X) ... Na≃Nd≃0, or Na≃Nd.

As the materials to be used for formation of a photoconductive layer constituted of a-Si(H,X) having the above conductivity of ③ through ⑦, there may preferably be included a great majority of the same materials as those mentioned in description of the aforesaid first barrier layer.

That is, when a photoconductive layer is to be prepared according to the glow discharge decomposition method, there may be employed $SiH_4$, $Si_2H_6$, $Si_3H_8$, $Si_4H_{10}$, $SiF_4$, $Si_2F_6$, $SiCl_4$, $SiBr_4$, $SiH_2F_2$, $SiH_2Cl_2$, $SiHCl_3$, $SiH_2Br_2$, $SiHBr_3$, etc.

Also in case of preparation according to the sputtering method, it may be conducted in the same manner as in preparation of the first barrier layer by use of a suitable material selected from the same materials.

As impurities to be contained in a photoconductive layer for the purpose of controlling the conductivity, there may be mentioned the same impurirites as those mentioned in description of the first barrier layer. That is, as a p-type impurity, typical examples are elements of the Group III of the Periodic table such as B, Al, Ga, In, Tl, etc., while as a n-type impurity, there may be mentioned the elements of the Group V of the Periodic table such as N, P, As, Sb, Bi, etc. These impurities may be incorporated in a suitable amount in a photoconductive layer during formation of the layer so that the desired characteristics, especially dark resistance and photosensitivity may have satisfactory values.

In the present invention, these impurities may be contained in the photoconductive layer in an amount of $3 \times 10^{-2}$ atomic % or less in case of an impurity of the Group III of the Periodic table, and $5 \times 10^{-3}$ atomic % or less in case of the impurity of the Group V of the Periodic table.

For the purpose of effective application of the photoconductive member of the present invention as an image forming member for electrophotography, it is desirable to incorporate H or/and X in a suitable amount in the photoconductive layer in order to make higher the dark resistance, photosensitivity as well as SN ratio (ratio of photocurrent to dark current) of the photoconductive layer. In this case, the amount of H or X to be incorporated in the photoconductive layer, or total amount of (H+X) when both H and X are incorporated may be generally 1-40 atomic %, preferably 5-30 atomic %.

The photoconductive layer may have a thickness which can suitably be determined as desired so that the photocarriers generated in the photoconductive layer may be transported in a predetermined direction with good efficiency, and may generally be 1 to 100 $\mu$, preferably 1 to 80 $\mu$, most preferably 5 to 50 $\mu$.

In the photoconductive layer of the photoconductive member according to the present invention, there may also be incorporated if desired at least one of carbon atom(C), nitrogen atom(N) and oxygen atom(O) for the purpose of further increasing the dark resistance of the layer.

These atoms can be incorporated structurally into the photoconductive layer 102 in the same manner as in formation of the second barrier layer 103-2 by using a suitable material selected from the same materials.

In the present invention, the quantity of carbon atom, nitrogen atom, oxygen atom optically contained in the photoconductive layer may generally be 0.001 atomic % to 30 atomic %, preferably 0.002 to 20 atomic %, most preferably 0.005 atomic % to 20 atomic %, as a sole quantity in case of incorporation of single species or as a total quantity in case of incorporation of plural species.

Figure 2:
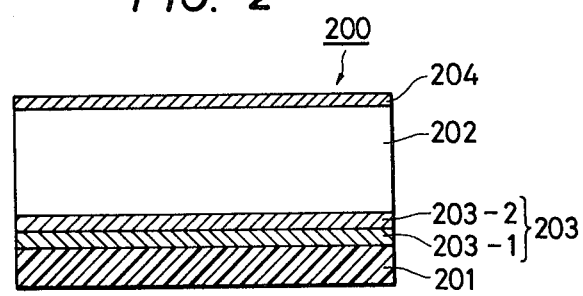

FIG. 2 shows a schematic sectional view for illustration of another embodiment of the photoconductive member according to the present invention. The photoconductive member 200 shown in FIG. 2 has a surface barrier layer 204 provided on the surface of the photoconductive layer 202, otherwise having the same layer structure as the photoconductive layer 100 as shown in FIG. 1.

The surface barrier layer 204 has the function to prevent injection of charges into the photoconductive layer 202 when a charging treatment is applied on the layer surface.

The surface barrier layer 204 can be formed by the same method with use of the same material as in case of the second barrier layer 103-2 as shown in FIG. 1.

The surface barrier layer may have a thickness which can suitably be determined depending on the relation to selection of a constituent material so as to fullfill the above function and the required characteristics, but may generally be 30 Å to 5 μ, preferably 50 Å to 1 μ.

EXAMPLE 1

Figure 3:
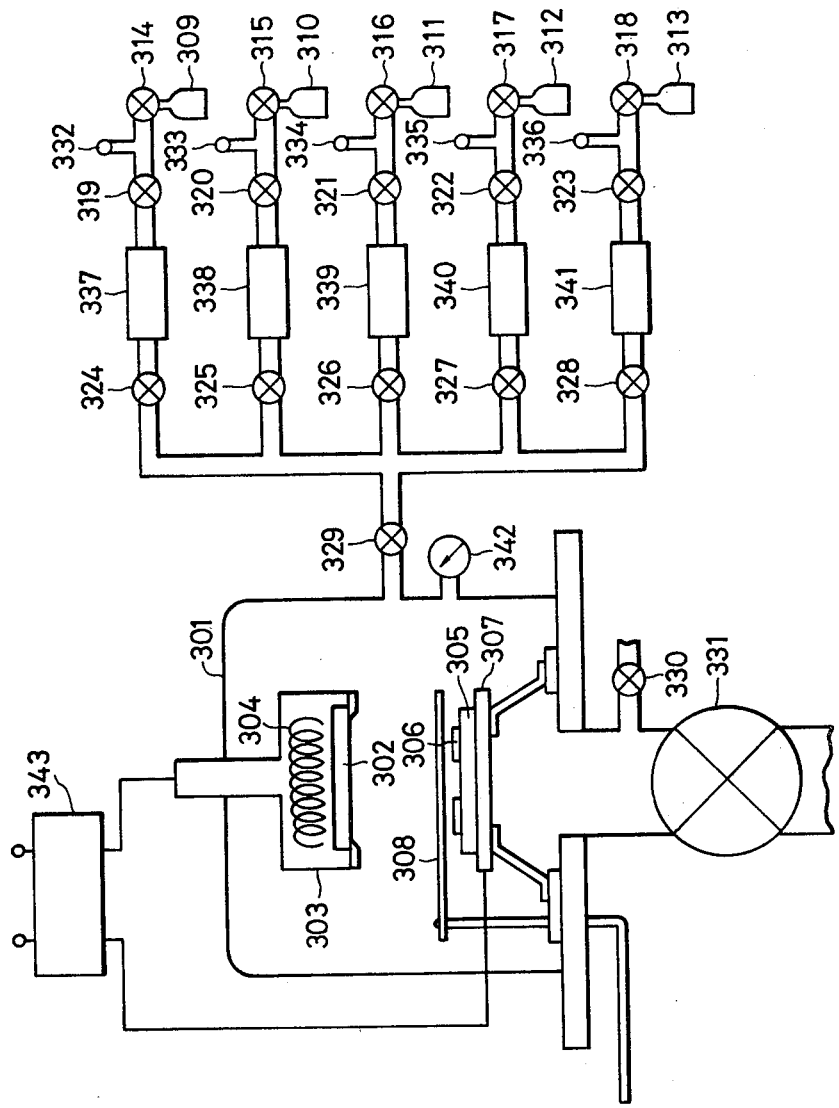
FIG. 3 a schematic flow chart for illustration of one example of the device for preparation of the photoconductive member according to the present invention.

Using a device as shown in FIG. 3 placed in a clean room which had been completely shielded, a photoconductive member having the layer structure as shown in FIG. 1 was prepared according to the following procedures.

A substrate of stainless steel 302 of 10 cm sequare having a thickness of 0.5 mm, whose surface had been cleaned, was fixed firmly on a supporting member 303 disposed at a predetermined position in a deposition chamber 301. The target for sputtering consisted of a polycrystalline, high purity silicon wafer (99.999%) 306 provided on a high purity graphite wafer (99.999%) 305. At this time, the shutter 308, which was also the electrode was closed. The substrate 302 was heated by a heater 304 within the supporting member 303 with a precision of ±0.5° C. The temperature was measured directly at the backside of ths substrate 302 by an alumelchromel thermocouple. Then, after confirming that all the valves in the system were closed, the main valve 331 was opened fully to evacuate once to about $5 \times 10^{-7}$ Torr (during this operation all the valves in the system were closed). Subsequently, the auxiliary valve 329, and then the outflow valves 324, 325, 326, 327, 328 were opened to remove sufficiently the gases in the flowmeters 337, 338, 339, 340 and 341. Then, the outflow valves 324, 325, 326, 327 and 328 and the auxiliary valve 329 were closed. The heater 304 was then turned on to set the substrate temperature at 250° C. Then, the valve 314 of the bomb 309 containing SiH$_4$ gas (purity: 99.999%) diluted with H$_2$ to 10 vol.% [hereinafter referred to as SiH$_4$(10)/H$_2$] and the valve 315 of the bomb 310 containing B$_2$H$_6$ gas diluted with H$_2$ to 500 vol.ppm [hereinafter referred to as B$_2$H$_6$(500)/H$_2$] were respectively opened to adjust the pressures at the outlet pressure gages 332 and 333, respectively, to 1 kg/cm$^2$, whereupon the inflow valves 319, 320 were gradually opened to permit SiH$_4$(10)/H$_2$ gas and B$_2$H$_6$(500)/H$_2$ gas to flow into the flowmeters 337 and 338, respectively. Subsequently, the outflow valves 324 and 325 were gradually opened, followed by opening of the auxiliary valve 329. The inflow valves 319 and 320 were adjusted thereby so that the gas feed ratio of B$_2$H$_6$/SiH$_4$ was 350 vppm. Then, while carefully reading the pirani gage 342, the opening of the auxiliary valve 329 was adjusted and it was opened to the extent until the inner pressure in the chamber 301 became $1 \times 10^{-2}$ Torr. After the inner pressure in the chamber 301 was stabilized, the main valve 331 was gradually closed to narrow its opening until the indication on the Pirani gage 342 became 0.2 Torr. After confirming that the gas feeding and the inner pressure were stabilized, the switch of high frequency power source 343 was turned on to input a high frequency power of 13.56 MHz between the electrode 308 and the supporting member 303, thereby generating glow discharge in the chamber 301 at an input power of 10 W. The above conditions were maintained for 4 minutes to form a first barrier layer by deposition of the p$^+$-type a-Si:H on the substrate 302. Thereafter, with the high frequency power source 343 being turned off for intermission of the glow discharge, the outflow valve 325 was closed, and then under the pressure of 1 kg/cm$^2$ (reading on the outlet pressure gage 334) of N$_2$ gas (purity: 99.999%) from the bomb 311 through the valve 316, the opening of the outflow valve 326 was determined by controlling the inflow valve 321 and the outflow valve 326 so that the reading on the flowmeter 339 may be 10 times as much as the flow amount of SiH$_4$ (10)/H$_2$ gas.

Subsequently, the high frequency power source 343 was turned on again to recommence glow discharge. The input power was 10 W. After glow discharging was thus maintained for 2 minutes to form a second barrier layer, with the high frequency power source 343 being turned off, the outflow valve 326 was closed. Thus, a barrier layer consisting of a first barrier layer and a second barrier layer was formed on the substrate 302.

Then, the outflow valve 325 was opened again and the flow amount concentration ratio of B$_2$H$_6$ gas to SiH$_4$ gas was adjusted to B$_2$H$_6$/SiH$_4$=10 vppm. By controlling the inflow valves 319, 320 and outflow valves 324 and 325. Subsequently, by adjusting the opening of the auxiliary valve 329, while watching carefully the reading on Pirani gage 342, the auxiliary valve 329 was opened until the inner pressure in the chamber 301 became $1 \times 10^{-2}$ Torr. After the inner pressure in the chamber 301 was stabilized, the main valve 331 was gradually closed to narrow its opening until the indication on the Pirani gage 342 became 0.2 Torr. After confirming that the gas inflow and the inner pressure were stabilized, the high frequency power source 343 was turned on to input a high frequency power of 13.56 MHz thereby generating glow discharge at an input power of 10 W. The above conditions were maintained for about 4 hours to form a photoconductive layer on the barrier layer formed on the substrate 302. Then, under intermission of glow discharge, with the high frequency source 343 being turned off, all the valves were closed. The main valve 331 was fully opened, thereby to make the inner pressure in the chamber 301 to less than $10^{-3}$ Torr. Then, the main valve 331 was closed and the inner pressure in the chamber 301 was made atmospheric through the leak valve 330. The substrate 302 having the layers thereon was taken out. The total thickness of the layers formed was about 12 μ.

The thus prepared image forming member for electrophotography was placed in an experimental device for charming and exposure to light. Corona charging was effected at ⊕6.0 KV for 0.2 sec, and immediately thereafter light image irradiated by use of a tungsten lamp as light source at a light quantity of about 1.0 lux.sec through a transmissive test chart.

Immediately thereafter, negatively (−) charged developers (containing toner and carrier) were cascaded on the surface of the above image forming member to obtain a good toner image on the surface of the above image forming member. When the toner image on the image forming member was transferred on a transfer paper by corona charging at ⊕5.0 KV, there was obtained a clear image of high density which was excellent in resolution as well as in gradation reproducibility.

The bombs 312, 313 are spare bombs in which gases used according to necessity are sealed.

Further, after similar charging and light exposure processes were repeated for 100,000 times, there were obtained transferred images, which were substantially free from the phenomenon of deterioration in image quality.

EXAMPLE 2

Various photoconductive members were prepared using the same device and the same conditions as in Example 1, except that the conditions for forming the first barrier layer and the second barrier layer were changed as shown in Table 1. The resultant photoconductive members were evaluated similarly as in Example 1 to give the result that each photoconductive member had good characteristics. In these experiments, in case of forming the second barrier layer according to the sputtering method, a sputtering material was set on the electrode 307 in the device as shown in FIG. 3, the shutter 308 was opened to permit introduction of a desired gas, and a high frequency power was inputted between the electrode 307 and the support 303.

TABLE 1

| Sample No. | | Starting gases (or target) | Preparation conditions Flow amount ratio | Preparation method | Power | Layer thickness |
|---|---|---|---|---|---|---|
| 2-1 | First barrier layer | $SiH_4$, $B_2H_6$, Ar | $B_2H_6/SiH_4 =$ 200 vppm | Glow | 10 W | 3000 Å |
| | Second barrier layer | Polycrystalline Si target + graphite target | Si:C = 1:9 | Sputter | 100 W | 800 Å |
| 2-2 | First barrier layer | | Same as Sample No. 2-1 | | | |
| | Second barrier layer | $SiH_4$, $C_2H_4$, $H_2$ | 1:9:50 | Glow | 5 W | 150 Å |
| 2-3 | First barrier layer | $SiF_4$, $B_2H_6$, Ar | $B_2H_6/SiF_4 =$ 400 vppm | Glow | 20 W | 2000 Å |
| | Second barrier layer | $SiF_4$, $C_2H_4$, Ar | 1:9:50 | Glow | 20 W | 500 Å |
| 2-4 | First barrier layer | | Same as Sample No. 2-3 | | | |
| | Second barrier layer | Polycrystalline Si target; $N_2$ (diluted with Ar to 50 vol. %) | — | Sputter | 100 W | 100 Å |
| 2-5 | First barrier layer | $SiH_4$, $B_2H_6$, $H_2$ | $B_2H_6/SiH_4 =$ 300 vppm | Glow | 5 W | 3000 Å |
| | Second barrier layer | $Al_2O_3$ target, Ar | — | Sputter | 150 W | 500 Å |

EXAMPLE 3

Various photoconductive members were prepared by the same procedures as described in Example 1 except that the discharging time was changed in preparation of the first barrier layer and the second barrier layer thereby to change the layer thicknesses of respective layers. Toner images were formed similarly as in Example 1, and overall evaluations of the images at the initial stage and after repeated copying for 50,000 times were conducted. The results are shown in Table 2.

TABLE 2

| First barrier layer | second barrier layer | | | | |
|---|---|---|---|---|---|
| | 10 Å | 30 Å | 400 Å | 1000 Å | 1.5μ |
| 50 Å | Δ | Δ | Δ | Δ | x |
| 200 Å | Δ | O | O | O | x |
| 1000 Å | Δ | O | O | O | x |
| 5000 Å | Δ | O | O | O | x |
| 2 μ | Δ | Δ | Δ | Δ | x | o : excellent
Δ: good
x: practically more or less questionable

EXAMPLE 4

Various photoconductive members were prepared in the same manner as in Example 1 except that the content of boron atoms in the first barrier layer was varied. Each photoconductive member was subjected to overall evaluation of the images formed at the initial stage and after repeated copying for 50,000 times. The results are shown in Table 3.

TABLE 3

| Boron content (atomic ppm) | 10 | 30 | 50 | 100 | 300 | 1000 | 5000 | 20000 |
|---|---|---|---|---|---|---|---|---|
| Evaluation | x | Δ | O | ⊚ | ⊚ | ⊚ | O | Δ |

O: Best
⊚ : Excellent
Δ: Good
x: Practically more or less questionable

EXAMPLE 5

A photoconductive member was prepared in entirely the same manner as in Example 1 except that $PH_3(500)/H_2$ gas (diluted to 500 vol.ppm with hydrogen) was used in place of $B_2H_6(500)/H_2$ gas and the flow amound concentration ratio changed to $PH_3/SiH_4 = 250$ vppm in formation of the first barrier layer. The thus obtained image forming member was placed in a charging-light exposure experimental device, and corona charging was effected at $\ominus 5.5$ KV for 0.2 sec, followed immediately by irradiation of a light image at a light quantity of 1.0 lux.sec.

Immediately thereafter, developing was performed by cascading $\oplus$ charged developer on the surface of the member. When the toner image was transferred by corona charging of $\ominus 5.5$ KV on a transfer paper, whereby there was obtained a clear image of high density which was excellent in resolution as well as in gradation reproducibility. This member could sufficiently stand repeated uses of 100,000 times.

EXAMPLE 6

Various photoconductive members were prepared in entirely the same manner as in Example 5 except that the content of phosphorus atom in the first barrier layer was varied as shown in Table 4. Each photoconductive member was subjected to evaluation of the toner images formed in the same manner as in Example 5 at the initial stage and after repeated uses of 50,000 times. The results are shown in Table 4.

TABLE 4

| Phosphorus content (atomic ppm) | 10 | 30 | 50 | 100 | 300 | 1000 | 5000 | 12000 |
|---|---|---|---|---|---|---|---|---|

TABLE 4-continued

| Evaluation | x | Δ | ○ | ◉ | ◉ | ◉ | ○ | Δ |

◉: Best
○: Excellent
Δ: Good
x: Practically more or less questionable

EXAMPLE 7

After the steps to formation of the photoconductive member in Example 1 were repeated in the same manner, a surface barrier layer was formed in the same manner as in formation of the second barrier layer except that the discharging time was elongated to 10 minutes, namely 5 times as long as that in formation of the second barrier layer. The thus obtained photoconductive member has a constitution as schematically shown in FIG. 2, which was evaluated of the image by the same method as in Example 1 to give very good result.

What we claim is:

1. A photoconductive member comprising a support for photoconductive member, a photoconductive layer constituted of an amorphous material comprising silicon atom as a matrix and a barrier layer between said support and said photoconductive layer, said barrier layer having a double-layer structure layered from the side of said support of a first barrier layer comprising an amorphous silicon material containing (i) hydrogen or halogen and (ii) impurities wherein (i) and (ii) are in amounts sufficient to impede the injection of free carriers from the support and a second barrier layer constituted of an electrically insulating material different from said amorphous material constituting said first barrier layer.

2. A photoconductive member according to claim 1, wherein the barrier layer has the function to prevent injection of free carriers from the side of said support toward the side of said photoconductive layer and permit passage of photocarriers migrating toward the side of said support among the photocarriers generated in said photoconductive layer upon irradiation with an electromagnetic wave, to which said photoconductive layer is sensitive, to the side of said support.

3. A photoconductive member according to claim 1, wherein the amorphous material constituting the photoconductive layer contains at least one of hydrogen atom and halogen atom.

4. A photoconductive member according to claim 1, wherein the second barrier layer is constituted of an amorphous material containing at least one selected from the group consisting of carbon atom, nitrogen atom and oxygen atom in the matrix of silicon atom.

5. A photoconductive member according to claim 4, wherein the amorphous material contains at least one of hydrogen atom and halogen atom.

6. A photoconductive member according to claim 1, wherein the second barrier layer is constituted of an electrically insulating metal oxide.

7. A photoconductive member according to claim 1, wherein the content of impurities in the first barrier layer is 30 to $5 \times 10^4$ atomic ppm.

8. A photoconductive member according to claim 1, wherein the first barrier layer has a thickness of 50 Å to 2 μ.

9. A photoconductive member according to claim 1, wherein the second barrier layer has a thickness of 10 Å to 1.2 μ.

10. A photoconductive member according to claim 1, wherein the impurity is a p-type impurity.

11. A photoconductive member according to claim 10, wherein the p-type impurity is an atom selected from the atoms belonging to the Group III of the Periodic table.

12. A photoconductive member according to claim 1, wherein the impurity is a n-type impurity.

13. A photoconductive member according to claim 12, wherein the n-type impurity is an atom selected from the atoms belonging to the Group V of the Periodic table.

14. A photoconductive member according to claim 1 which comprises further a surface barrier layer.

15. A photoconductive member according to claim 14, wherein the thickness of said surface barrier layer ranges from 30 Å to 5 μ.

16. A photoconductive member according to claim 14, wherein the surface barrier layer is made from the material to that of the second barrier layer.

17. A photoconductive member according to claim 1, wherein the photoconductive layer contains at least one member selected from the group consisting of carbon, nitrogen, and oxygen atoms.

18. A photoconductive member according to claim 17, wherein the content of oxygen atoms ranges from 0.001 to 30 atomic %.

19. A photoconductive member according to claim 17, wherein the content of nitrogen atoms ranges from 0.001 to 30 atomic %.

20. A photoconductive member according to claim 17, wherein the content of carbon atoms ranges from 0.001 to 30 atomic %.

21. A photoconductive member according to claim 1, wherein the photoconductive layer contains hydrogen atoms.

22. A photoconductive member according to claim 21, wherein the content of hydrogen atoms ranges from 1 to 40 atomic %.

23. A photoconductive member according to claim 1, wherein the content of halogen atoms ranges from 1 to 40 atomic %.

24. A photoconductive member according to claim 1, wherein the photoconductive layer contains both hydrogen and halogen atoms.

* * * * *